United States Patent [19]

Ballato

[11] Patent Number: 4,636,678
[45] Date of Patent: Jan. 13, 1987

[54] COMPENSATION OF ACOUSTIC WAVE DEVICES

[75] Inventor: Arthur Ballato, Long Branch, N.J.

[73] Assignee: The United States of America as represented by the Secretary of the Army, Washington, D.C.

[21] Appl. No.: 707,346

[22] Filed: Mar. 1, 1985

[51] Int. Cl.[4] .............................................. H01L 41/08
[52] U.S. Cl. ........................... 310/313 R; 310/313 R; 310/313 D; 333/153; 330/5.5; 331/107 A
[58] Field of Search ........... 310/313 B, 313 C, 313 R, 310/313 D; 333/152, 153, 154, 195; 330/5.5; 331/107 A

[56] References Cited

U.S. PATENT DOCUMENTS

| | | | |
|---|---|---|---|
| 3,633,118 | 1/1972 | Means et al. | 331/107 A |
| 3,675,054 | 7/1972 | Jones et al. | 310/313 B |
| 3,717,819 | 2/1973 | Adler | 330/5.5 |
| 3,742,396 | 6/1973 | Bahr et al. | 310/313 B |
| 3,833,867 | 9/1974 | Solie | 330/5.5 X |
| 4,016,514 | 4/1977 | Reeder et al. | 310/313 B X |
| 4,288,765 | 9/1981 | Mikoshiba et al. | 330/5.5 X |
| 4,354,166 | 10/1982 | Grudkowski | 331/107 A |
| 4,357,553 | 11/1982 | Minagawa et al. | 310/313 B |

FOREIGN PATENT DOCUMENTS 0652690 3/1979 U.S.S.R. ................ 330/5.5

OTHER PUBLICATIONS

"Doubly Rotated Thickness Mode Plate Vibrators", A. Ballato, *Physical Acoustics*, vol. 13, Academic Press, N.Y., 1977, p. 153, Polarizing Effect described.
"Piezoelectric Resonators", A. Ballato, *Design of Crystal and Other Harmonic Oscillators*, John Wiley & Sons, 1983, pp. 113-114, Frequency shift described.
"Shallow Bulk Acoustic Wave Progress and Prospects", A. Ballato, *IEEE Trans. Microwave Theory Tech.*, vol. MTT-27, Dec. 1979, pp. 1004-1012, FIG. 9 discloses FIG. 2 of application.

*Primary Examiner*—Mark O. Budd
*Attorney, Agent, or Firm*—Sheldon Karnars; Jeremiah G. Murray; John T. Rehberg

[57] ABSTRACT

Compensation for the effects of environmentally caused changes and aging on piezoelectric acoustic wave devices is electrically provided by the application of a signal, such as a DC bias voltage, to the finger elements of an interdigital transducer formed on the surface of the acoustic wave device. This produces very large field concentrations at the finger edges which act to magnify the electric field and accordingly the electroacoustic effect which alters the acoustic velocity of surface acoustic waves, shallow bulk acoustic waves and reflected bulk acoustic waves propagating in a piezoelectric substrate between input and output interdigital transducers.

7 Claims, 11 Drawing Figures

COMPENSATION OF ACOUSTIC WAVE DEVICES

The invention described herein may be manufactured or used by or for the Government for governmental purposes without the payment of any royalties thereon or therefor.

BACKGROUND OF THE INVENTION

1. Field of the Invention

This invention relates generally to piezoelectric acoustic wave devices and more particularly to adjustment of the resonant frequency of piezoelectric acoustic wave devices.

2. Description of the Prior Art

The existence of an effect referred to as the polarizing or electroacoustic effect is well known to those skilled in the art and occurs in all piezoelectric crystals. Whereas piezoelectricity produces strains when an electric field is applied, the electroacoustic effect changes the effective elastic constants by a small amount which operate to vary the acoustic velocity of surface acoustic waves, shallow bulk acoustic waves and reflected bulk acoustic waves being propagated in the body of the crystal. The overall result is a change in the resonant frequency of such devices or delay times provided thereby. So far as known, however, the effects are relatively small but is known to be larger in strong piezoelectric materials such as lithium niobate and lithium tantalate than in quartz which is a relatively weak piezoelectric material. The strength or weakness of the effect, insofar as presently known, appears to be due to the uniform electric field used. In bulk wave resonators, this appears natural since the electrodes produce the uniform field of a parallel capacitor. In surface acoustic wave devices, the effect which is relatively weak is due to the use of auxiliary electrodes that are conventionally used to produce the uniform field.

It is an object of the present invention, therefore, to provide an improvement in piezoelectric acoustic wave devices.

It is a further object of the invention to provide a method and apparatus for adjusting the characteristic parameters of piezoelectric acoustic wave devices.

It is another object of the invention to provide a method and means for compensating for the effects of environmentally caused changes in aging on piezoelectric acoustic wave devices.

It is still a further object of the invention to provide a method and apparatus for providing a deliberate adjustment in variation of certain parameters for adjusting the resonant frequency of piezoelectric acoustic wave devices.

SUMMARY

Briefly, the foregoing and other objects are achieved by the application of an elastic-constant-altering signal, such as a DC bias, across the finger elements of an interdigital transducer formed on the surface of a piezoelectric wave device including surface acoustic wave devices, shallow bulk acoustic wave devices and reflected bulk acoustic wave devices. The bias voltage applied to the finger elements produces relatively large field concentrations at the finger edges which act to magnify the electric field and accordingly the electroacoustic effect within the piezoelectric material causing the acoustic velocity of acoustic waves propagating in or on the device to change which in turn causes a change in the resonant frequency of the device and/or its time delay.

BRIEF DESCRIPTION OF THE DRAWING

While the present invention is defined in the claims annexed to and forming a part of this specification, a better understanding can be had by reference to the following description when taken in conjunction with the accompanying drawings in which:

DETAILED DESCRIPTION OF THE INVENTION

Figure 1A:
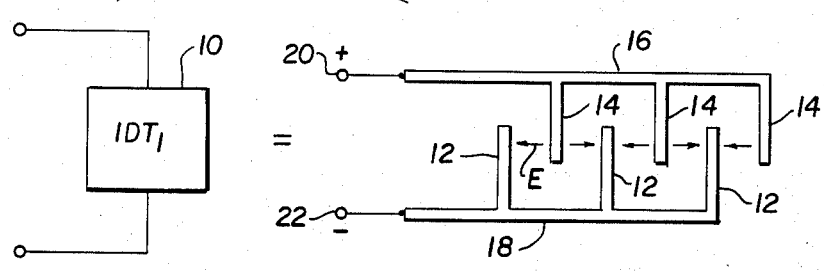
FIGS. 1A and 1B are diagrams illustrative of two types of interdigital transducers which are utilized in the subject invention.
Figure 1B:
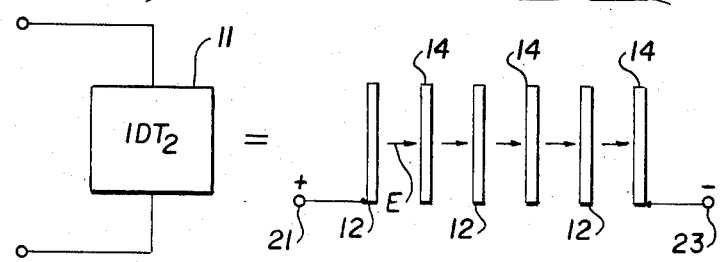

Referring now to the drawings and more particularly to FIG. 1A, reference numeral 10 schematically denotes a first type interdigital transducer device $IDT_1$ while reference numeral 11 of FIG. 1B denotes a second type interdigital transducer $IDT_2$. $IDT_1$ is particularly adapted for launching and/or receiving acoustic waves propagating in a body, such as a plate-like structure, of piezoelectric material, while $IDT_2$ is particularly useful for controlling the propagation of such waves following launch. The piezoelectric material is comprised of singly or doubly rotated cuts of quartz, a relatively weak piezoelectric material, or lithium niobate ($LiNbO_3$) or lithium tantalate ($LiTaO_3$), relatively strong piezoelectric materials. The structure of $IDT_1$ as shown in FIG. 1A is well known and is generally comprised of interleaved sets of metallized strips or fingers 12 and 14 which are respectively connected to or part of a pair of elongated conductor strips 16 and 18. In such a configuration, when a DC potential is applied across a pair of terminals 20 and 22 connected to the ends of the elongated strips 16 and 18, the electric fields E between the fingers 12 and 14 alternately reverse direction as shown in FIG. 1. As to the structure of FIG. 1B, it comprises a unipolar embodiment and is provided by effectively disconnecting the finger elements 12 and 14 of FIG. 1A from the elongated members 16 and 18 by eliminating the latter members and connecting one terminal 21 of a pair of terminals 21 and 23 to the first finger element 12 while the other terminal 22 is connected to the last finger element 14. Upon the application of a potential across the terminals 21 and 23, the electric fields E between the fingers 12 and 14 are unidirectional.

Figure 2:
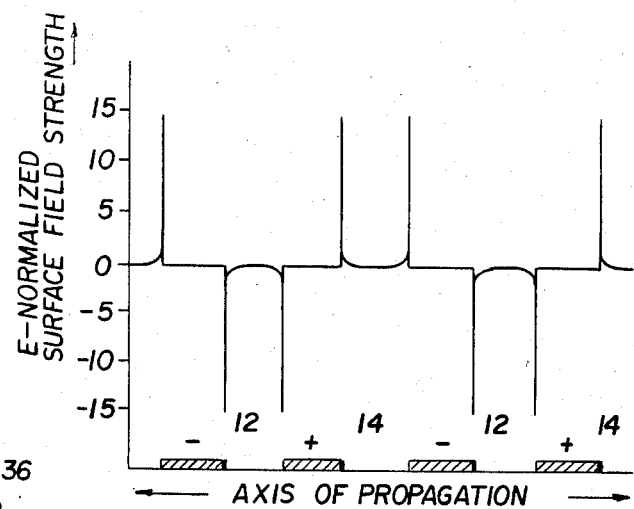
FIG. 2 is a graph illustrative of the electric field concentration for a DC potential applied to an interdigital transducer such as shown in FIG. 1A.

It should also be noted that the fingers 12 and 14 of an IDT produce electric fields E that are very sharply peaked at their edges. An example of this characteristic is shown in FIG. 2 and was previously disclosed in the publication by the present inventor entitled, "Shallow Bulk Acoustic Wave Progress And Prospects", which appeared in the *IEEE Transactions On Microwave Theory And Techniques*, Vol. MTT-27, No. 12, December, 1979, at pp. 1004–1012. As shown in FIG. 2, the field E has very sharp peaks. For very thin electrodes it can be shown that the field E possesses branch-point singularities at each edge of the fingers 12 and 14. These E field singularities form the basis for the present invention since the presence of these very large field concentrations can be used to magnify the electric field thus producing a relatively large electroacoustic effect, a feature which up to now has been unappreciated.

Prior to considering the preferred embodiments of this invention, a surface acoustic wave (SAW) device in accordance with the known prior art will be first discussed. Such a device is disclosed in FIGS. 3A and 3B. As shown, the prior art SAW device 24 is comprised of a singly or doubly rotated cut of piezoelectric material, which has been formed into a plate-like structure which will be referred to hereinafter as a substrate and which is indicated by reference numeral 26. On the top surface 28 of the substrate 26 there is located an input IDT which is identified by reference numeral $10_1$ and comprises an $IDT_1$ type structure. Spaced a predetermined distance from the input IDT $10_1$ the surface 28 is similarly configured $IDT_1$ type output IDT which is identified by reference numeral $10_2$. With the application of an RF input signal across the terminals $20_1$ and $22_1$ connected to the input IDT $10_1$, a surface acoustic wave is launched therefrom to the output IDT $10_2$ with the energy being confined largely to within one wavelength of the surface. Upon reaching the output IDT $10_2$, the RF signal is sensed across the output terminals $20_2$ and $22_2$. Additionally, a set of auxiliary electrodes which are shown by reference numerals 30 and 32 are located between the input and output $IDT_1$ type IDTs $10_1$ and $10_2$. The two auxiliary electrodes 30 and 32 are separated a predetermined distance apart and further include terminals 34 and 36 across which can be applied a DC bias voltage. With the application of a DC voltage across terminals 34 and 36, a uniform electric field E is produced and which can be used, for example, to change the resonance frequency of the device.

Figure 3A:
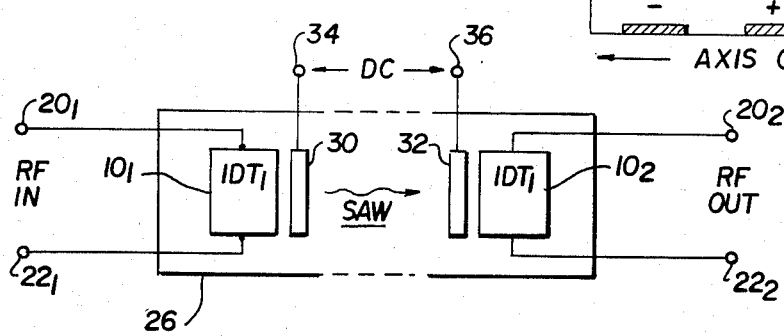
FIGS. 3A and 3B comprise a top plan view and a side plan view of a piezoelectric acoustic wave device in accordance with the known prior art.
Figure 3B:
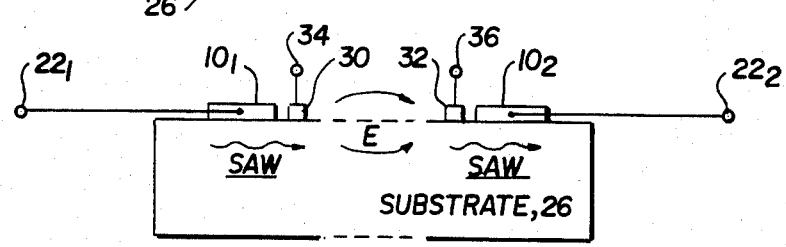

The present invention has for its object the elimination of the auxiliary electrodes 30 and 32 as shown in FIGS. 3A and 3B in favor of producing an elastic-constant-altering electric field by means of an IDT structure, such as shown in FIGS. 1A and 1B, whereby the sharp metallic edges produce large field concentrations as shown in FIG. 2 to magnify the electroacoustic effect. This is shown by the devices illustrated in FIGS. 4, 5 and 6 and comprise either a surface acoustic wave (SAW) device or a shallow bulk acoustic wave (SBAW) device and a reflected bulk acoustic wave (RBAW) device as shown in FIGS. 7A and 7B.

Figure 4:
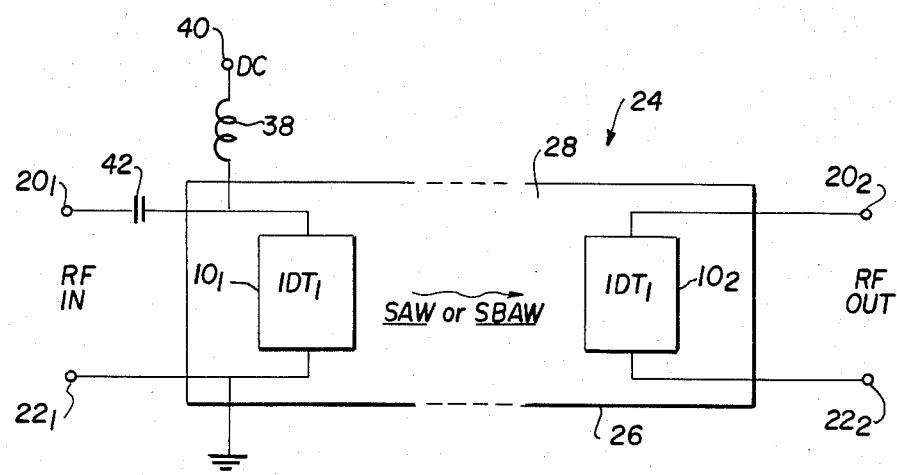
FIGS. 4, 5, and 6 comprise top plan views of three embodiments of a surface acoustic wave or shallow bulk acoustic wave device in accordance with the subject invention.

Referring now to FIG. 4 which is illustrative of a first embodiment of the invention, it includes a coupling of an elastic constant altering signal in the form of a DC bias potential to the acoustic wave launching device $10_1$ comprising an $IDT_1$ type device. This is shown by the inclusion of a blocking inductor 38 coupled between one side of the $IDT_1$ type IDT $10_1$ and a DC voltage application terminal 38. The opposite side of the IDT $10_1$ is shown connected to a point of reference potential which is illustrated as ground. Additionally, an AC coupling capacitor is also provided between the RF signal input terminal $20_1$ and the side of the IDT $10_1$ to which the blocking inductor 38 is connected. Accordingly, SAW or SBAW signals are transmitted from the input IDT $10_1$ to the similarly configured $IDT_1$ type output IDT $10_2$ with an enhanced frequency changing signal being generated as the result of the application of the DC bias potential to the input IDT $10_1$ via the terminal 40.

Figure 5:
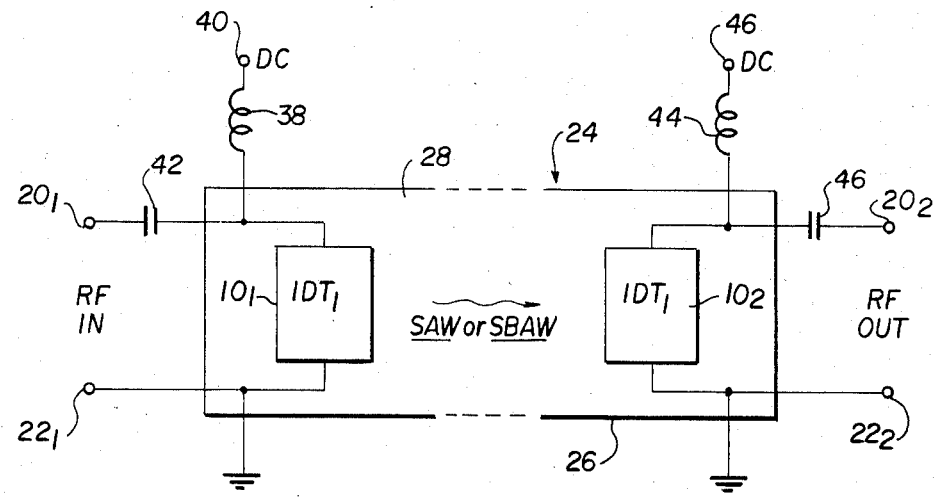

The second embodiment as shown in FIG. 5 is a duplication of the first embodiment; however, a second DC bias potential is applied to the output IDT $10_2$ by means of a second blocking inductor 44 connected between a DC bias application terminal 46 and one side of the IDT $10_2$ as well as an output AC coupling capacitor 46 connected between the IDT $10_2$ and the output terminal $20_2$. The opposite side of the output IDT $10_2$ common to the output terminal $22_2$ is also shown connected to ground in the same fashion or in the same manner as the input side of the device. Whereas the first embodiment as shown in FIG. 4 operates with but a single DC bias potential for varying the resonance frequency of the device, the embodiment of FIG. 5 discloses the use of two DC bias potentials being applied.

The third embodiment involves the application of a biasing DC voltage by means of an $IDT_2$ type IDT 11, as shown in FIG. 1B, being located on the surface 28 of the piezoelectric substrate 26 between the input IDT $10_1$ which, as noted above is of an $IDT_1$ type and the output IDT $10_2$ which is also of an $IDT_1$ type. The intermediate IDT 11 also includes a pair of terminals 21 and 23 across which is applied a biasing DC potential. With the static field distribution such as shown in FIG. 2 between the input and output IDTs $10_1$ and $10_2$, it can be readily appreciated that the electroacoustic effect will be enhanced far beyond that achievable by the known prior art due to the multiplicity of the finger elements making up the IDT as shown in FIG. 1.

Figure 6:
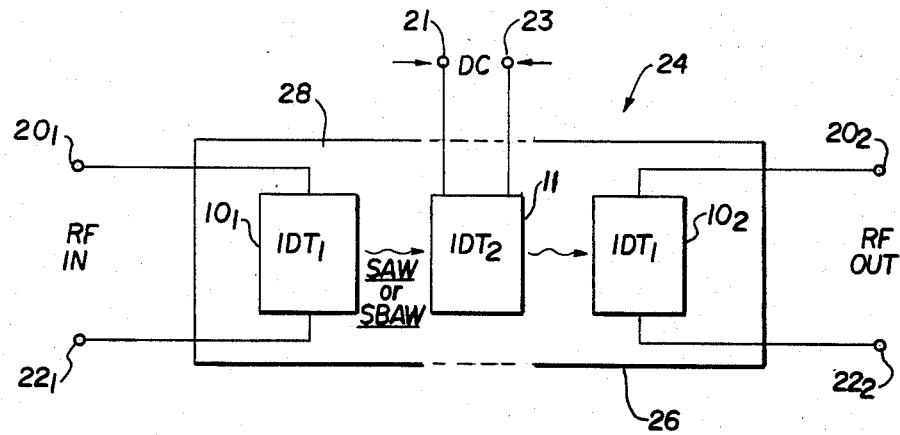
Figure 7A:
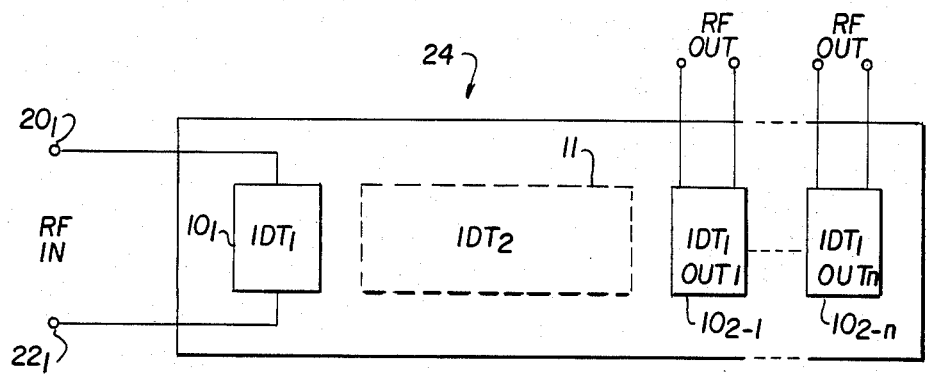
FIGS. 7A and 7B are a top plan view and a side plan view of a reflected bulk acoustic wave device in accordance with the subject invention.
Figure 7B:
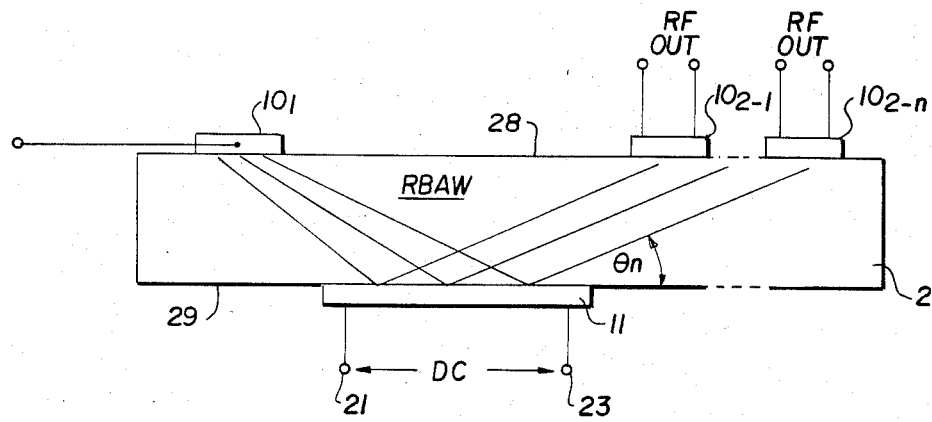

Whereas the three embodiments of the invention considered with respect to configurations shown in FIGS. 4 through 6 are specifically illustrative of SAW or SBAW devices, the same concept can also be utilized for reflected bulk acoustic wave (RBAW) devices; however, another embodiment which is particularly applicable to RBAW devices is shown in FIGS. 7A and 7B. There the piezoelectric substrate 26 includes not only an $IDT_1$ type input device $10_1$, but a plurality of $IDT_1$ type output IDTs $10_{2-1} \ldots 10_{2-n}$ for a plurality of output stages 1 through n which are separated from each other in successive equal and/or unequal increments of distance along the top surface 28 of the substrate 26. Additionally, an $IDT_2$ type device 11 is located on the bottom surface 29 of the substrate 26 and has for its purpose the generation of an electric field in the region of the substrate where RBAW signals launched from the input IDT $10_1$ are reflected from the bottom surface 29 to the output IDTs $10_{2-1}$ and $10_{2-n}$. The angle of reflection $\theta_n$ is a function of the DC voltage applied across the terminals $20_3$ and $22_3$ as shown in FIG. 7B. In both this configuration and that of FIG. 6, the IDT 11 may be considered a control IDT, whereas in the first two embodiments shown in FIGS. 4 and 5, the control is additionally provided both in the input IDT or in both the input and output IDTs.

Thus the magnification of the electroacoustic effect can be used not only to alter the acoustic velocities of the waves propagated as well as the device resonant frequency or time delay provided thereby, but also the critical angles of reflection may be altered. Moreover, the various disturbances such as provided by the environmental parameters or aging can be sensed by including a sensor on the devices of the subject invention to sense a particular disturbance and generating a signal in accordance therewith. This signal then may be utilized to control the magnitude of the DC bias voltage applied. Furthermore, when desirable, AC signals can be applied in place of or in addition to the DC bias potentials for providing various types of modulation, keying and/or coding.

Figure 8:
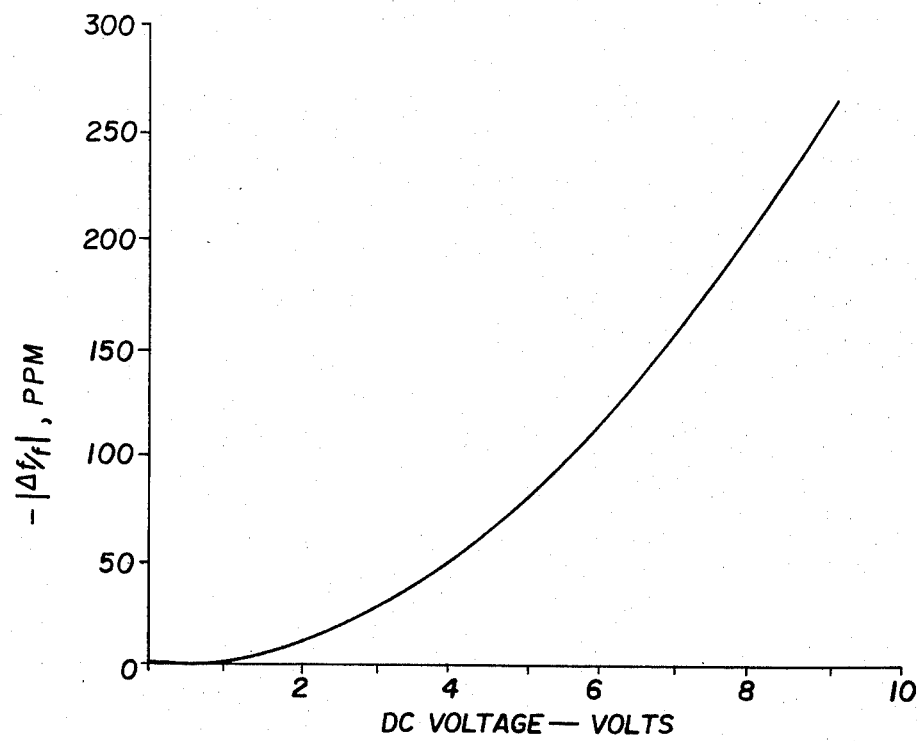
FIG. 8 is a characteristic curve illustrative of the change of frequency with respect to voltage for a device in accordance with the subject invention.

A characteristic curve illustrative of the change in resonant frequency with respect to a DC voltage applied in accordance with the teachings of this invention, is shown in FIG. 8. There a generally parabolic curve of a normalized change in frequency $\Delta f/f$ has been experimentally obtained with a configuration in its simplest form, i.e. the embodiment shown in FIG. 4. It is evident that as the magnitude of the DC voltage and the resulting electric field increases, a corresponding change occurs in the resonant frequency of the device.

Thus what has been shown and described is a relatively fast, simple and accurate electronic method and means for altering the effective elastic constants of a piezoelectric acoustic wave device and which may be used, for example, to adjust its frequency, modulate a propagating acoustic wave, compensate for acceleration and temperature changes as well as compensating for electromagnetic pulse (EMP) events and changes resulting from radiation.

Having thus shown and described what is at present considered to be the preferred method and embodiments of the invention, it should be noted that the same has been made by way of illustration and not limitation. Accordingly, all modifications, alterations and changes coming within the spirit and scope of the invention are herein meant to be included.

I claim:

1. A method of altering the effective elastic constants in piezoelectric acoustic wave devices, comprising the steps of:
    launching acoustic wave signals from input interdigital transducer means located on a first surface of a body of piezoelectric material;
    receiving said acoustic wave signals by output interdigital transducer means located on said first surface of said body of piezoelectric material; and
    applying an elastic-constant-altering signal to interdigital transducer means located on a second surface of said body of piezoelectric material whereby the relatively large electric field concentrations at the edges of the finger elements constituting said transducer means operates to magnify the electroacoustic effect and thus alter the acoustic velocity of acoustic waves propagating between said input and output interdigital transducers.

2. The method as defined by claim 1 wherein said elastic-constant-altering signal comprises a DC signal.

3. The method as defined by claim 1 wherein said step of receiving said acoustic wave signal comprises the step of receiving said acoustic wave signals by a plurality of mutually separated output interdigital transducers located on said same surface of said body of piezoelectric material.

4. The method as defined by claim 1 wherein said body of piezoelectric material comprises a plate-like body selected from material including quartz, lithium niobate, and lithium tantalate.

5. A piezoelectric acoustic device, comprising:
    a body of piezoelectric material;
    input interdigital transducer means located on a first surface of said body of piezoelectric material;
    output interdigital transducer means located on said first surface of said body of piezoelectric material; and
    interdigital transducer means located on a second surface of said body of piezoelectric material for receiving an elastic-constant-altering signal, said interdigital transducer means including a plurality of finger elements, whereby the relatively large electric field concentrations at the edges of said finger elements operate to magnify the electroacoustic effect within said body of piezoelectric material.

6. The piezoelectric acoustic device as defined by claim 5 wherein said elastic-constant-altering signal comprises a DC signal.

7. The piezoelectric acoustic device as defined by claim 5 wherein said output interdigital transducer means comprises a plurality of selectively spaced interdigital transducers and whereby the magnitude of said DC voltage operates to alter the angle of reflection of acoustic waves launched from said input interdigital transducer means as reflected bulk acoustic waves to said plurality of output interdigital transducers.

* * * * *